(12) United States Patent
Okazaki et al.

(10) Patent No.: US 9,953,808 B2
(45) Date of Patent: Apr. 24, 2018

(54) ARC EVAPORATION SOURCE

(71) Applicant: NIPPON ITF, INC., Kyoto (JP)

(72) Inventors: Naoto Okazaki, Kyoto (JP); Ken Yoshihara, Kyoto (JP); Hiroshi Ishizuka, Kyoto (JP); Tomoyasu Matsuno, Kyoto (JP); Shinji Narahara, Kyoto (JP)

(73) Assignee: NIPPON ITF, INC., Kyoto (JP)

( * ) Notice: Subject to any disclaimer, the term of this patent is extended or adjusted under 35 U.S.C. 154(b) by 156 days.

(21) Appl. No.: 14/787,272

(22) PCT Filed: Apr. 30, 2013

(86) PCT No.: PCT/JP2013/062560
§ 371 (c)(1),
(2) Date: Oct. 27, 2015

(87) PCT Pub. No.: WO2014/178100
PCT Pub. Date: Nov. 6, 2014

(65) Prior Publication Data
US 2016/0086770 A1    Mar. 24, 2016

(51) Int. Cl.
| H01J 37/34 | (2006.01) |
| H01J 37/32 | (2006.01) |
| C23C 14/32 | (2006.01) |

(52) U.S. Cl.
CPC ...... *H01J 37/32055* (2013.01); *C23C 14/325* (2013.01); *H01J 37/3266* (2013.01);
(Continued)

(58) Field of Classification Search
CPC .................................................. H01J 37/345
See application file for complete search history.

(56) References Cited

U.S. PATENT DOCUMENTS

| 2011/0259733 A1* | 10/2011 | Watanabe ............... C23C 14/35 |
| | | 204/192.12 |
| 2011/0315544 A1* | 12/2011 | Goikoetxea Larrinaga ............. C23C 14/325 |
| | | 204/192.38 |
| 2012/0261253 A1* | 10/2012 | Madocks ............ C23C 14/3407 |
| | | 204/192.1 |

FOREIGN PATENT DOCUMENTS

| JP | 2000-212729 | 8/2000 |
| JP | 2004-527662 | 9/2004 |

(Continued)

OTHER PUBLICATIONS

"Office Action of China Counterpart Application", with machine English translation thereof, dated Aug. 31, 2016, p. 1-p. 10.
(Continued)

*Primary Examiner* — Timon Wanga
(74) *Attorney, Agent, or Firm* — JCIPRNET

(57) ABSTRACT

Provided is an arc evaporation source for melting and evaporating a cathode material by arc discharge for film formation on a surface of a substrate, and including a cathode formed in a substantially disc shape and a magnetic field generating apparatus, disposed at a back side of the cathode. The magnetic field generating apparatus generates a magnetic field which forms magnetic lines that form an acute angle with respect to a substrate direction at an outer circumferential surface of the cathode, magnetic lines that are substantially perpendicular to the discharge surface at an outermost circumference part of the discharge surface of the cathode, and magnetic lines that form an acute angle with respect to a center direction of the cathode at a region towards the outer circumferential surface of the discharge surface of the cathode, by at least one permanent magnet disposed at the back side of the cathode.

4 Claims, 13 Drawing Sheets

(52) U.S. Cl.
CPC .. *H01J 37/32614* (2013.01); *H01J 37/32669* (2013.01); *H01J 2237/327* (2013.01); *H01J 2237/332* (2013.01)

(56) References Cited

FOREIGN PATENT DOCUMENTS

| | | |
|---|---|---|
| JP | 2007-056347 | 3/2007 |
| JP | 3924833 | 6/2007 |
| JP | 2009-543951 | 12/2009 |
| JP | 2012-517522 | 8/2012 |
| JP | 2013-023741 | 2/2013 |

OTHER PUBLICATIONS

"International Search Report (Form PCT/ISA/210)", dated Jul. 9, 2013, with English translation thereof, pp. 1-4, in which five of the listed references (JP2013-023741, JP2007-056347, JP2004-527662, JP2000-212729 and JP2012-517522) were cited.

* cited by examiner

ARC EVAPORATION SOURCE

CROSS-REFERENCE TO RELATED APPLICATION

This application is a 371 application of the international PCT application serial no. PCT/JP2013/062560, filed on Apr. 30, 2013. The entirety of the above-mentioned patent application is hereby incorporated by reference herein and made a part of this specification.

BACKGROUND OF THE INVENTION

Field of the Invention

The invention relates to an arc evaporation source used in an arc ion plating device.

Description of Related Art

For film formation of a ceramic hard film on a substrate, conventionally, an arc ion plating method using an arc ion plating device for evaporating and ionizing a cathode material of an arc evaporation source by arc discharge in a vacuum is commonly used for film formation on a surface of the substrate (work) (for example, patent documents 1 and 2).

An example of the arc evaporation source used in this type of arc ion plating method is illustrated in FIG. 24. Referring to FIG. 24, the arc evaporation source is constructed by a cathode 1 machined in a disc shape and fixed by a fixing ring 2, and a permanent magnet 4 disposed on a side of the cathode 1 that is opposite to the side of the discharge surface such that the direction of the magnetic poles is oriented along the axis direction of the cathode 1. In addition, 3 denotes one of the magnetic lines emitted by the permanent magnet 4.

Arc spots are formed on the discharge surface of the cathode 1 sequentially by arc discharge such that the cathode material evaporates; however, the arc spots have a tendency to move in an acute angle direction relative to the magnetic field.

Therefore, in FIG. 24, in addition to disposing the magnet 4 at a back side of the cathode 1, a part near the outer circumference of the cathode 1 is machined in a bank shape, so as to control the arc state. By using this type of cathode, the magnetic line 3 emitted by the magnet 4 is formed so as to spread outward in the radius direction of the cathode, and in addition the arc spots are prevented from escaping out of the discharge surface of the cathode. However, since the discharge area is mainly concentrated near the outer circumference on the inner side of the bank, as the number of batches of film formation increases, the shape of the cathode 1 changes from the shape illustrated by the dotted line in FIG. 25 to the shape illustrated by the solid line, such that the cathode material is not able to be effectively used up to the center portion of the discharge surface.

In addition, as shown in FIG. 26, instead of machining the part near the outer circumference of the cathode 1 into a bank shape, techniques have been proposed to construct the arc evaporation source so as to include a tapered confinement ring 5 at the outer circumference of the cathode 1, such that arc spots are prevented from escaping.

However, in this case, since the outer circumference of the cathode 1 is covered by the confinement ring 5, the outer circumference of the discharge surface is not able to be used to the fullest and interferes with the effective utilization of the cathode material.

That is to say, as shown in FIGS. 27(a) and (b), cathode materials having the same area (the hatching portion of the figure) as viewed from the cross section view are used, however in 3-dimensional terms the volume of the cathode material utilized may be represented by, $$V2=V1\times(D2\div D1)$$

and since D2>D1, it may be seen that the outer circumference may be used to the fullest and a larger volume of the cathode material may be used, so as to be utilized effectively.

PRIOR ART LITERATURE

Patent Documents

Patent Document 1: Japanese Patent No. 3924833
Patent Document 2: Japanese Published Unexamined Application No. 2009-543951

SUMMARY OF THE INVENTION

Problem to be Solved

An objective of the invention is to provide an arc evaporation source which may significantly increase the utilization efficiency of a cathode material which has a configuration that an entirety or a part of the outer circumferential surface is exposed, by using the outer circumference of the cathode to the fullest.

Solution to the Problem

According to an embodiment, the invention provides an arc evaporation source for melting and evaporating a cathode material by arc discharge in a vacuum for film formation on a surface of a substrate. The arc evaporation source includes a cathode formed in a substantially disc shape, and a magnetic field generating apparatus disposed at a back side of the cathode, wherein the magnetic field generating apparatus generates a magnetic field which forms magnetic lines that form an acute angle with respect to a substrate direction at an outer circumferential surface of the cathode, magnetic lines that are substantially perpendicular to a discharge surface at an outermost circumference part of the discharge surface of the cathode, and magnetic lines that form an acute angle with respect to a center direction of the cathode at a region towards the outer circumferential surface of the discharge surface of the cathode, by at least one permanent magnet disposed at a back surface of the cathode such that the magnetic poles are oriented in a direction that is 20° to 50° with respect to the discharge surface of the cathode.

As a result of various considerations and experimentation, the inventors have been led to think that by utilizing the tendency of the arc spots to move in an acute angle direction relative to the magnetic field, when a magnetic field is generated which forms magnetic lines that form an acute angle with respect to the substrate direction at the outer circumferential surface of the cathode, magnetic lines that are substantially perpendicular to the discharge surface at the outermost circumference part of the cathode discharge surface, and magnetic lines that form an acute angle with respect to the center direction of the cathode at the region towards the outer circumferential surface of the cathode discharge surface as shown by the 3 arrows in FIG. 1, then the arc spots will stay at the discharge surface and widely move in a range inside the discharge surface and will not move to the outer circumferential surface, and therefore the cathode material may be more effectively used.

More specifically, as shown in FIG. 2, a magnetic field (magnetic field distribution) satisfying 3 conditions is formed, namely if the angle formed by the discharge surface and the magnetic field (magnetic field vector) is θ, then a magnetic line at the outermost circumference part of the discharge surface has a θ of approximately 90°, a magnetic line at the discharge surface has a θ of under 90° (acute angle), and a magnetic line outside of the discharge surface has a θ of over 90° (obtuse angle). Furthermore, "θ of approximately 90°" at the outermost circumference part refers to that there may be a variation of about ±5°.

Next, the inventors considered specific magnetic field generating apparatus for forming the above mentioned magnetic field through magnetic field simulations.

First, as shown in FIG. 3, a ring shaped permanent magnet is disposed near the outer circumference of a back side of a cathode, such that the magnetic poles are oriented parallel to the axis direction of the cathode. However, in this case, "magnetic lines that are substantially perpendicular to the discharge surface at the outermost circumference part of the cathode discharge surface" could not be generated, and in addition "magnetic lines that form an acute angle with respect to the center direction of the cathode" could not be generated, either.

Next, as shown in FIG. 4, a ring shaped permanent magnet is magnetized/disposed at a back side of a cathode, such that the magnetic poles are oriented parallel to the discharge surface of the cathode. In this case, the above mentioned magnetic fields may be generated by suitably disposing the permanent magnet.

However, in this type of case, due to the configuration where the ring shaped permanent magnet occupies a large part of the space at the back surface of the cathode, a further modification which is later mentioned such as "one other magnetic field generating apparatus" is unable to be included, and the effective utilization of the cathode material is limited. Or, there is a possibility the cathode may become larger than necessary.

Therefore, the inventors determined that the 3 magnetic lines as shown in FIG. 5 may be respectively generated and that the space at the back side of the cathode may be ensured to be larger, by disposing the permanent magnet near the outer circumference of the cathode such that the N-pole and S-pole are in a slanted direction. Then, the aforementioned one other magnetic field generating apparatus, which is different from the above mentioned permanent magnet, is further disposed in the ensured larger space, such that the cathode material may be used more effectively.

Based on this idea, the inventors considered the magnetic fields formed when the angle formed by the direction of the magnetic poles and the discharge surface is changed from 0° to 90, as shown in FIG. 6 to FIG. 16. As a result, it was determined the permanent magnet should be disposed such that the angle formed by the direction of the magnetic poles and the discharge surface is 20° to 50°.

That is to say, when the angle formed by the direction of the magnetic poles and the discharge surface is under 20°, as shown in FIG. 6 and FIG. 7, the 3 magnetic lines may be formed. However, since the location where the magnet is disposed is close to the center direction of the cathode, the space at the back side of the cathode cannot be sufficiently ensured. On the other hand, when the angle is over 50°, as shown in FIG. 13 to FIG. 16, the location where the magnet is disposed becomes close to the outside of the cathode, and therefore even though the space at the back surface of the cathode can be ensured, magnetic lines which are obtuse with respect to the center direction of the cathode are unable to be formed outside of the discharge surface of the cathode. Furthermore, in FIG. 6 to FIG. 16, the N-pole and the S-pole may be interchanged.

Accordingly, from the above mentioned results, it was determined that the preferable angle is 40° to 45°.

That is to say, according to an embodiment of the invention, in the arc evaporation source, the permanent magnet is disposed such that the magnetic poles are oriented in a direction that is 40° to 45° with respect to the discharge surface of the cathode.

Next, according to an embodiment of the invention, in the arc evaporation source, at least one other magnetic field generating apparatus which rotates in a plane substantially parallel to the discharge surface of the cathode is disposed at the back side of the cathode.

In view of the forgoing findings, the inventors then considered preferable magnetic field generating apparatus to be disposed at the larger space ensured at the back surface of the cathode.

As a result, it was determined that by disposing a magnetic field generating apparatus rotating in a plane approximately parallel to the discharge surface of the cathode in the space, the discharge area becomes larger when the arc spots rotate and move in the discharge surface of the cathode due to the effect of the rotating magnetic field as shown in FIG. 18. Therefore, it is possible to utilize the cathode material across a larger area, further increasing the utilization efficiency of the cathode material. For this type of magnetic field generating apparatus, for example, as shown in FIG. 17, a magnetic field generating apparatus constructed by a ring shaped permanent magnet mounted on a rotating platform such that the center axis of the rotating platform and a center axis of the ring shaped permanent magnet are displaced is mentioned.

Furthermore, it is preferable that the rotation of the above mentioned magnetic field generating apparatus is performed without interfering with the arc discharge process.

Then, according to an embodiment of the invention, in the arc evaporation source, at least one magnetic field generating apparatus with a displacement apparatus such that a distance between the permanent magnet and the cathode may be changed, is disposed at the back side of the cathode.

According to considerations by the inventors, it was determined that the utilization efficiency of the cathode material is further increased by disposing a magnetic field generating apparatus with a displacement apparatus such that it is possible to change the distance between the permanent magnet and the cathode, for example, such as the magnetic field generating apparatus wherein a displacement apparatus is disposed on the ring shaped permanent magnet having opposite polarities at the inside and outside of the radius direction as shown in FIG. 19.

That is to say, by changing the distance between the permanent magnet and the cathode, the diameter of the discharge area where the arc spot moves on the discharge surface of the cathode may be changed as shown in FIG. 20, and therefore it is possible to utilize the cathode material across a larger area and further increasing the utilization efficiency of the cathode material. Furthermore, when a plurality of magnetic field generating apparatuses of this type are disposed, the utilization efficiency of the cathode material may be further increased.

Furthermore, similar to the rotation of the above mentioned magnetic field generating apparatus, it is preferable that the movement of the magnetic field generating apparatus is performed without interfering with the arc discharge process.

Effects of the Invention

The invention provides an arc evaporation source which significantly increases the utilization efficiency of a cathode material which has a configuration where an entirety or a part of the outer circumferential surface is exposed by using the external circumference of the cathode to the fullest.

DESCRIPTION OF THE EMBODIMENTS

The invention will be described in detail according to the embodiments below.

1. Manufacture of an Arc Evaporation Source

(1) Embodiment 1

Figure 21:
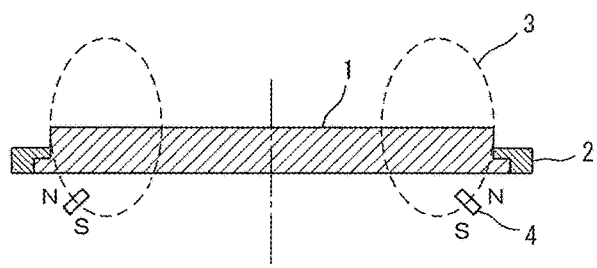
FIG. 21 is a diagram showing a configuration of an arc evaporation source used in embodiment 1.

An arc evaporation source of embodiment 1 was manufactured by disposing a permanent magnet 4 (configured by lining 45 pillar shaped isotropic ferrite magnets (diameter of 8 mm, thickness of 2 mm) into a ring shape at a 45° direction relative to the discharge surface of the cathode 1) at a back side of a cathode 1 machined into the shape shown in FIG. 21 from a disc shaped Ti cathode material with a diameter of 150 mm and thickness of 15 mm. At this time, the magnetic field near the outer circumference of the cathode was approximately 20 gauss.

In addition, as for the magnet, a ring shaped magnet magnetized in a slanted direction may be used, or a cube shaped magnet may be disposed to be aligned slanted on the circumference, for example.

(2) Embodiment 2

Figure 1:
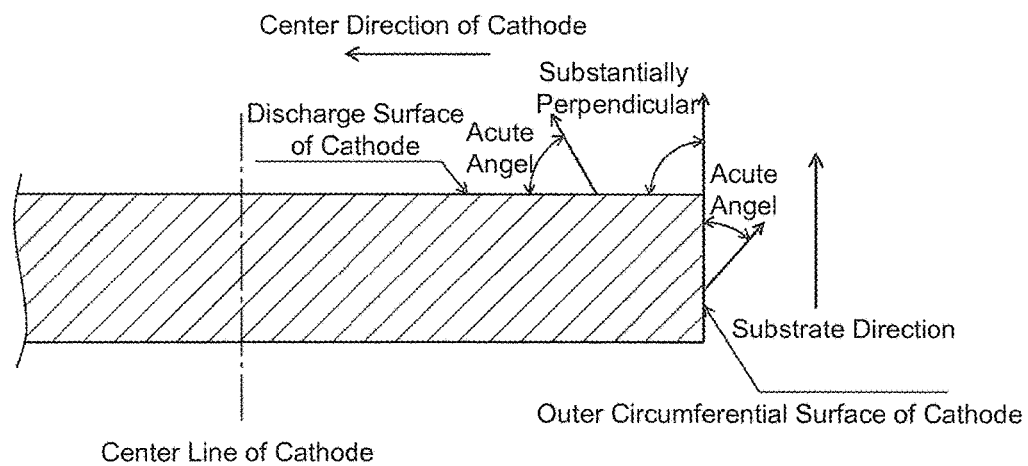
FIG. 1 is a diagram showing a magnetic field formed in an arc evaporation source.
Figure 2:
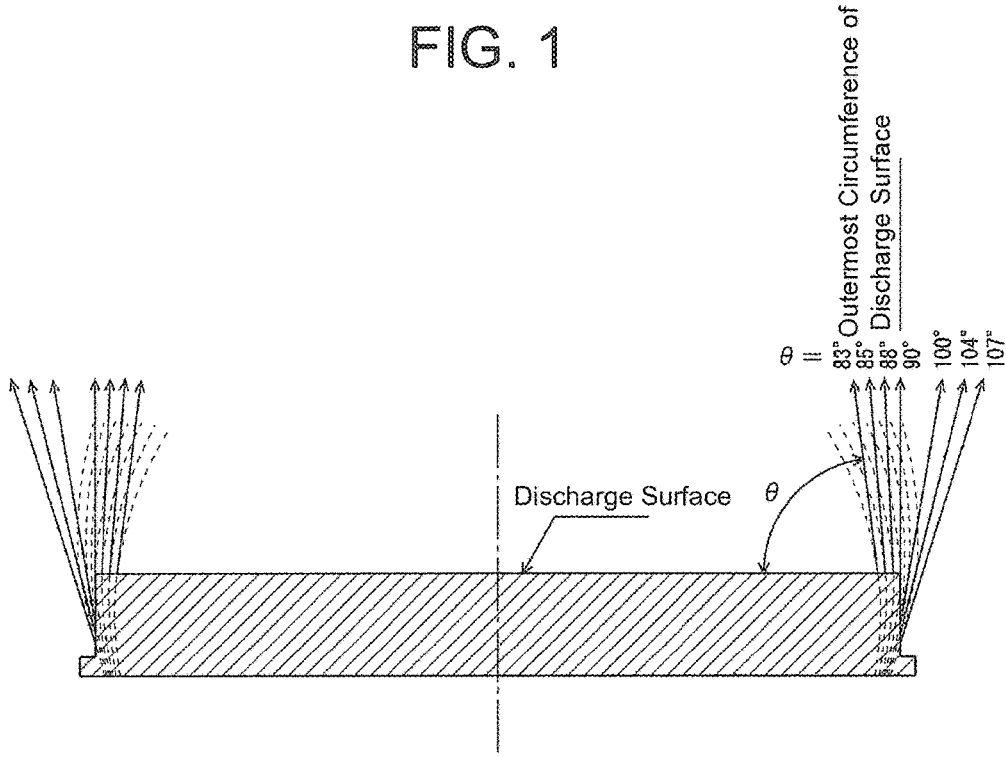
FIG. 2 is a diagram showing angles formed by a discharge surface and a magnetic field in an arc evaporation source.
Figure 3:
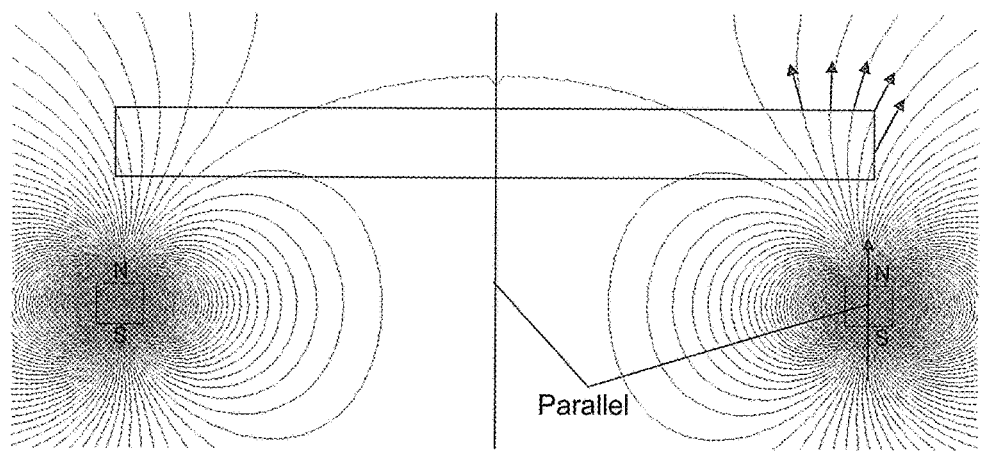
FIG. 3 is a diagram showing a magnetic field formed when a ring shaped permanent magnet is disposed near the outer circumference of a back surface of a cathode, such that the magnetic poles are oriented parallel to the axis direction of the cathode.
Figure 4:
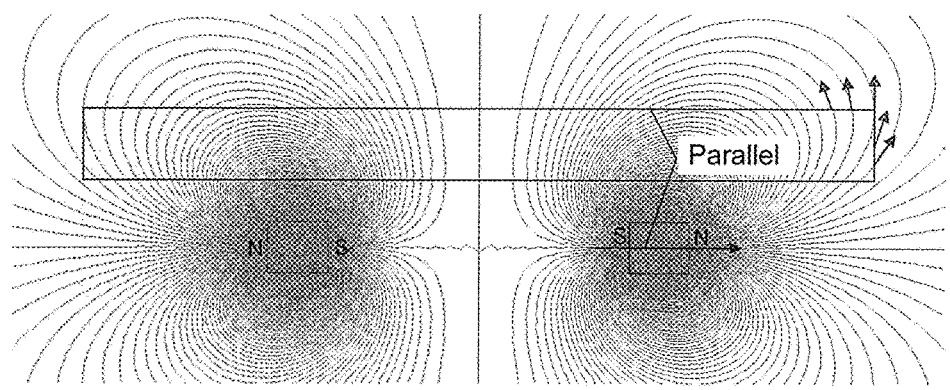
FIG. 4 is a diagram showing a magnetic field formed when a ring shaped permanent magnet is disposed at a back surface of a cathode, such that the magnetic poles are oriented parallel to the discharge surface of the cathode.
Figure 5:
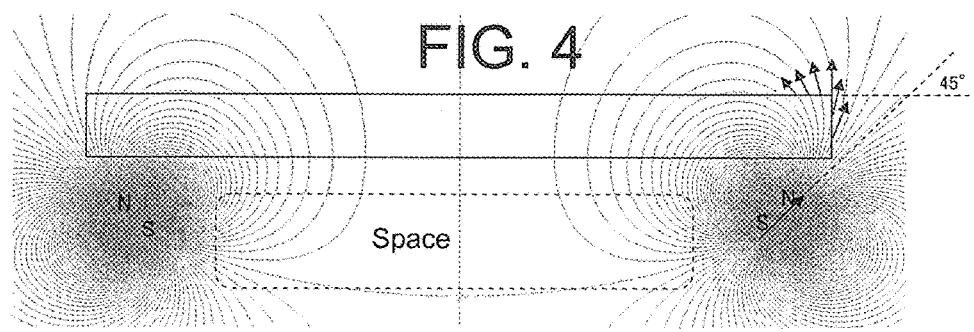
FIG. 5 is a diagram showing a magnetic field formed when a permanent magnet is disposed in a slanted direction near the outer circumference of a cathode.
Figure 6:
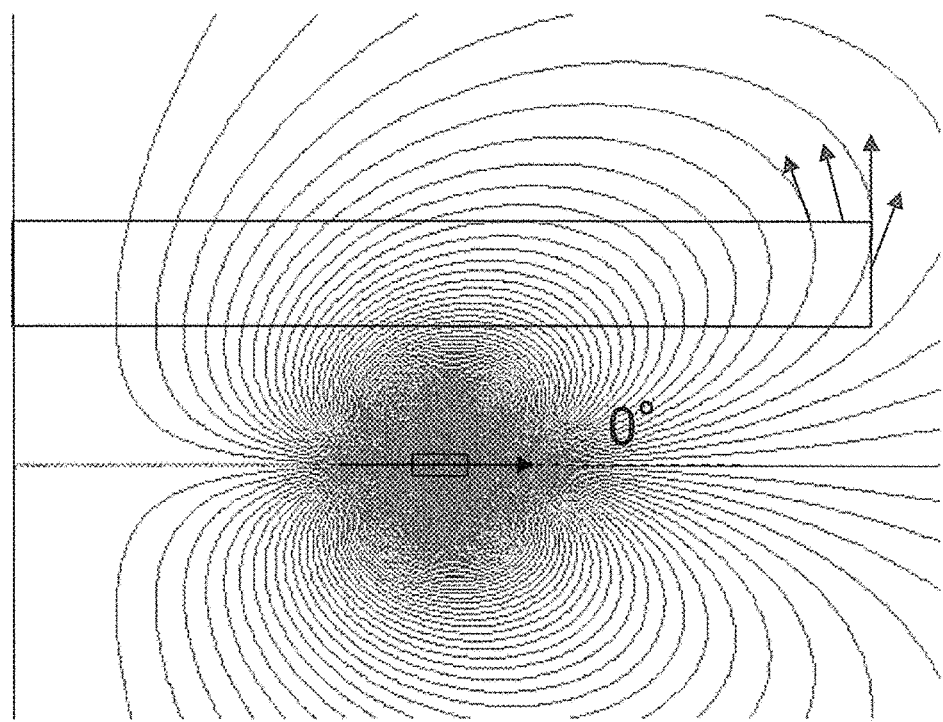
FIG. 6 is a diagram showing a magnetic field formed when an angle formed by the direction of the magnetic poles and the discharge surface is 0°.
Figure 7:
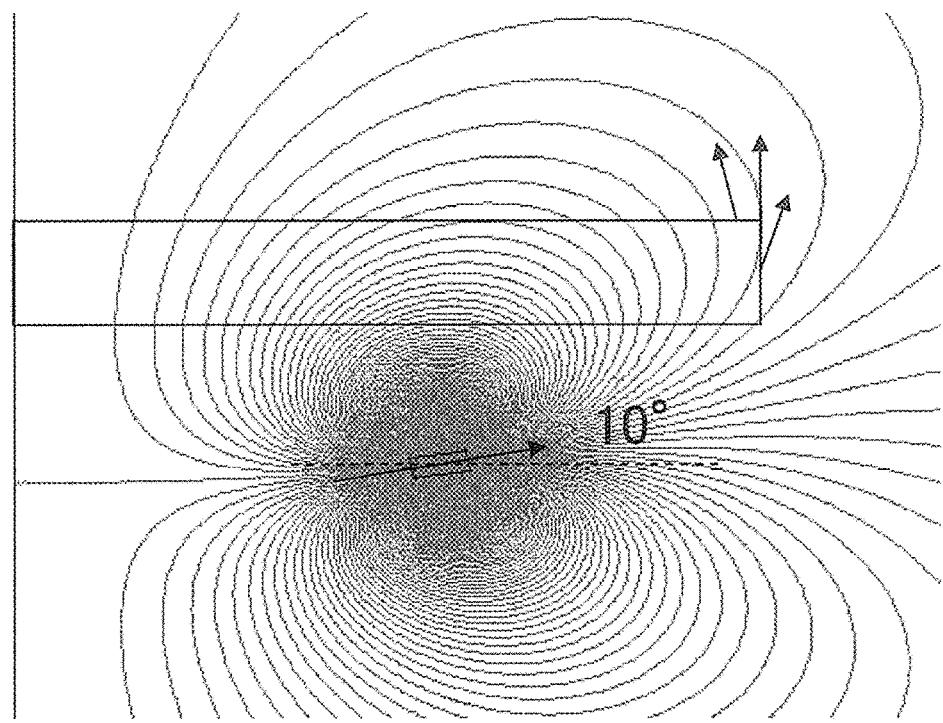
FIG. 7 is a diagram showing a magnetic field formed when an angle formed by the direction of the magnetic poles and the discharge surface is 10°.
Figure 8:
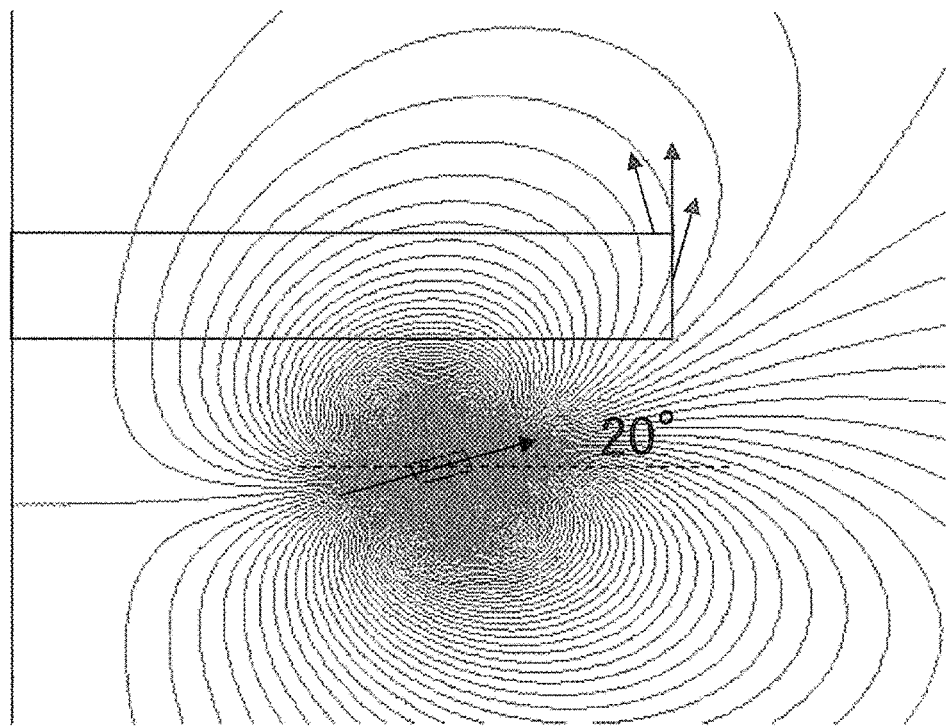
FIG. 8 is a diagram showing a magnetic field formed when an angle formed by the direction of the magnetic poles and the discharge surface is 20°.
Figure 9:
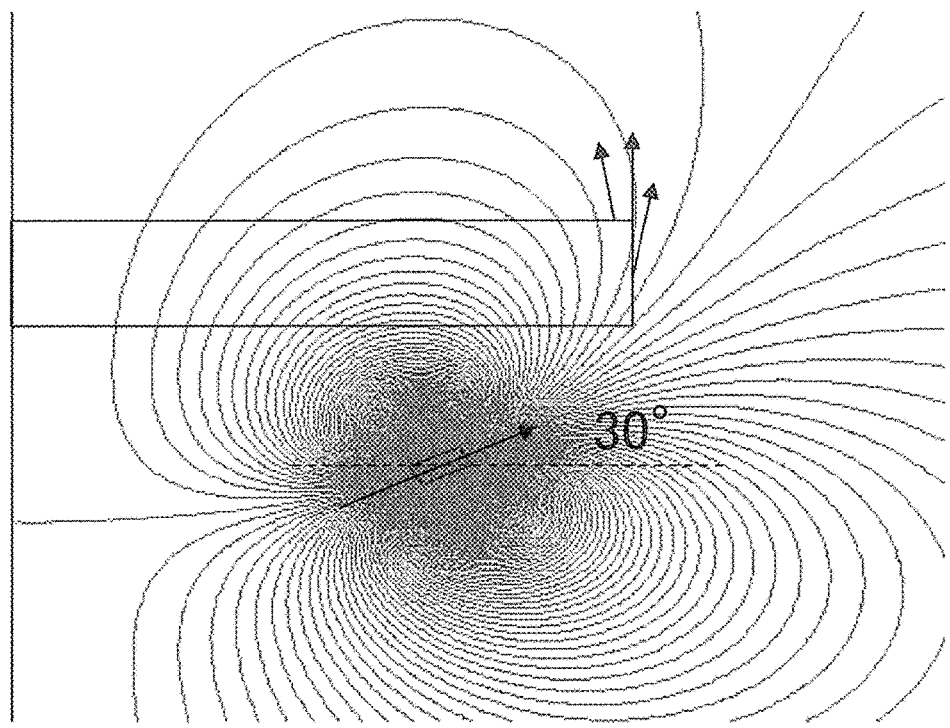
FIG. 9 is a diagram showing a magnetic field formed when an angle formed by the direction of the magnetic poles and the discharge surface is 30°.
Figure 10:
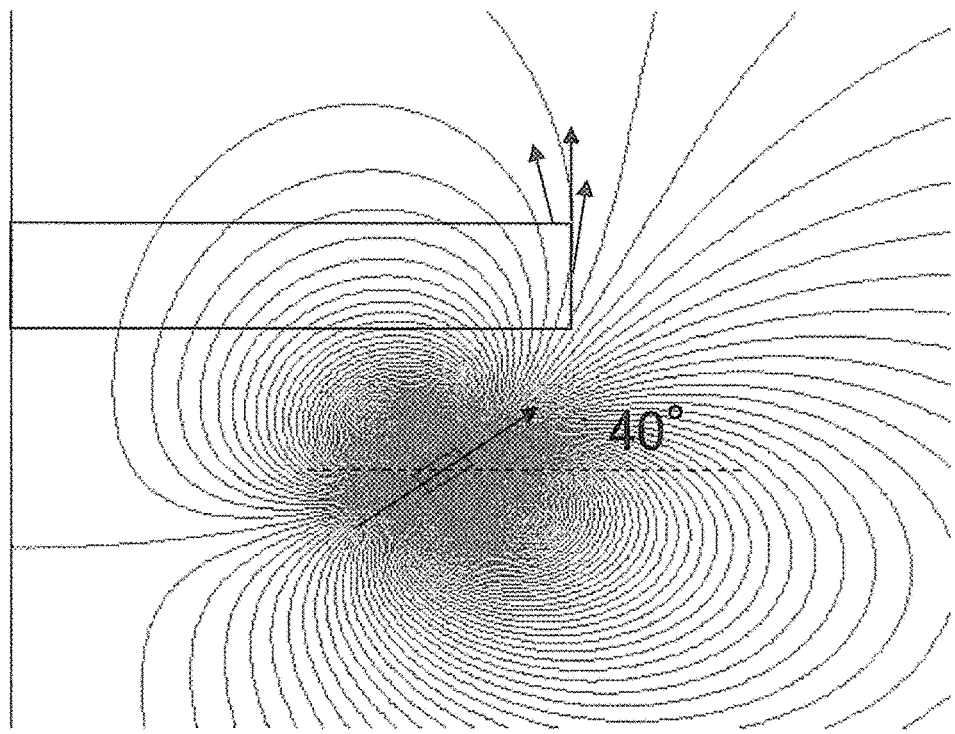
FIG. 10 is a diagram showing a magnetic field formed when an angle formed by the direction of the magnetic poles and the discharge surface is 40°.
Figure 11:
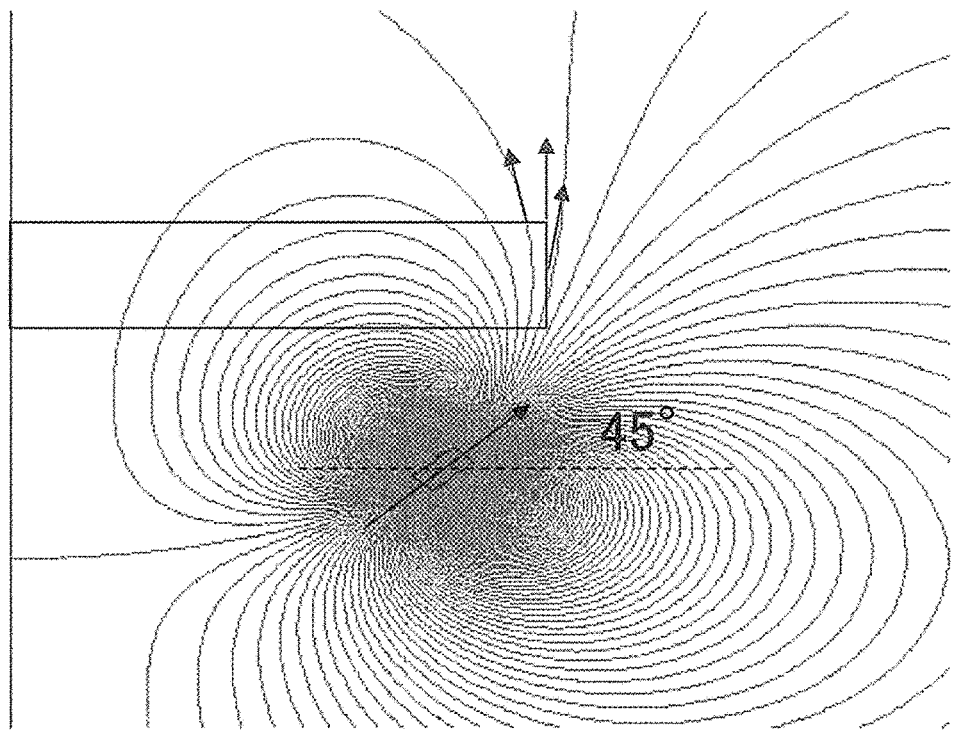
FIG. 11 is a diagram showing a magnetic field formed when an angle formed by the direction of the magnetic poles and the discharge surface is 45°.
Figure 12:
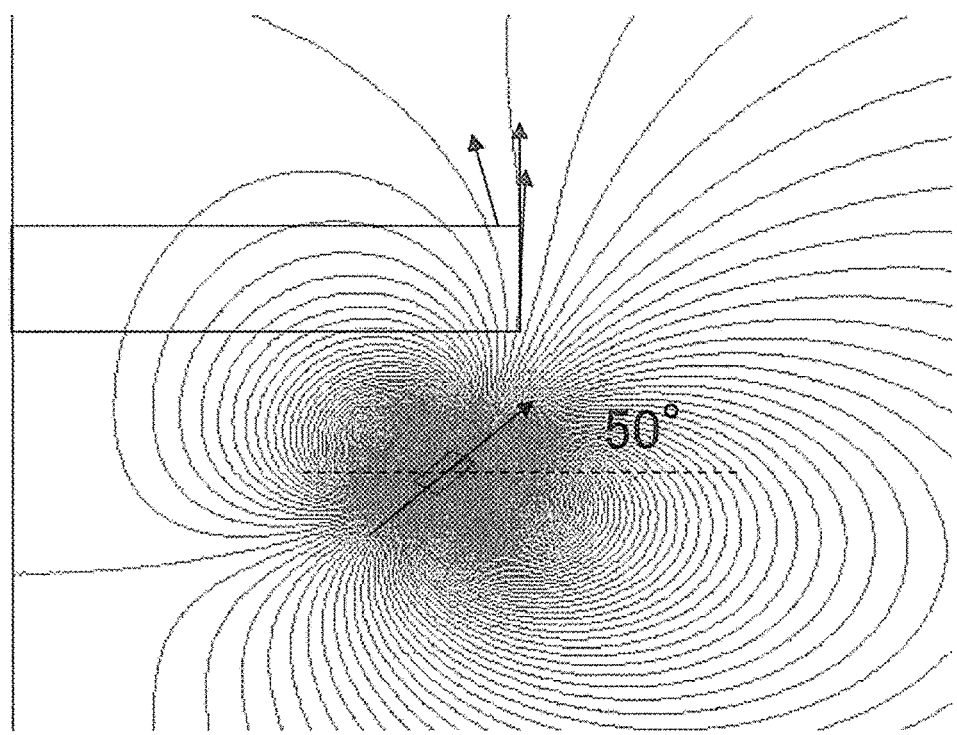
FIG. 12 is a diagram showing a magnetic field formed when an angle formed by the direction of the magnetic poles and the discharge surface is 50°.
Figure 13:
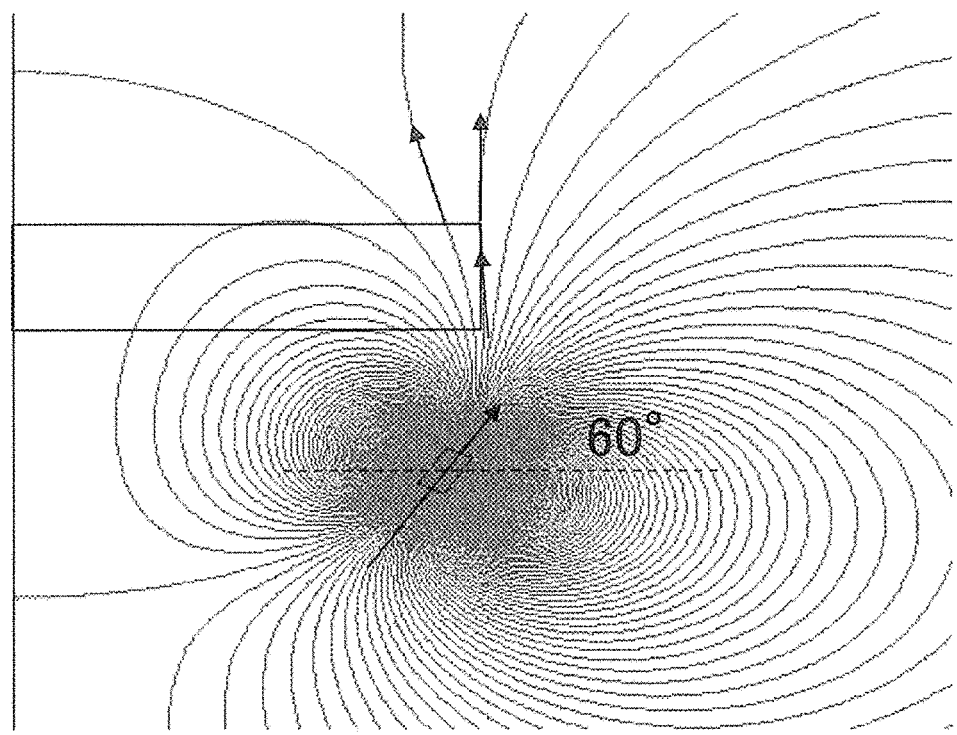
FIG. 13 is a diagram showing a magnetic field formed when an angle formed by the direction of the magnetic poles and the discharge surface is 60.
Figure 14:
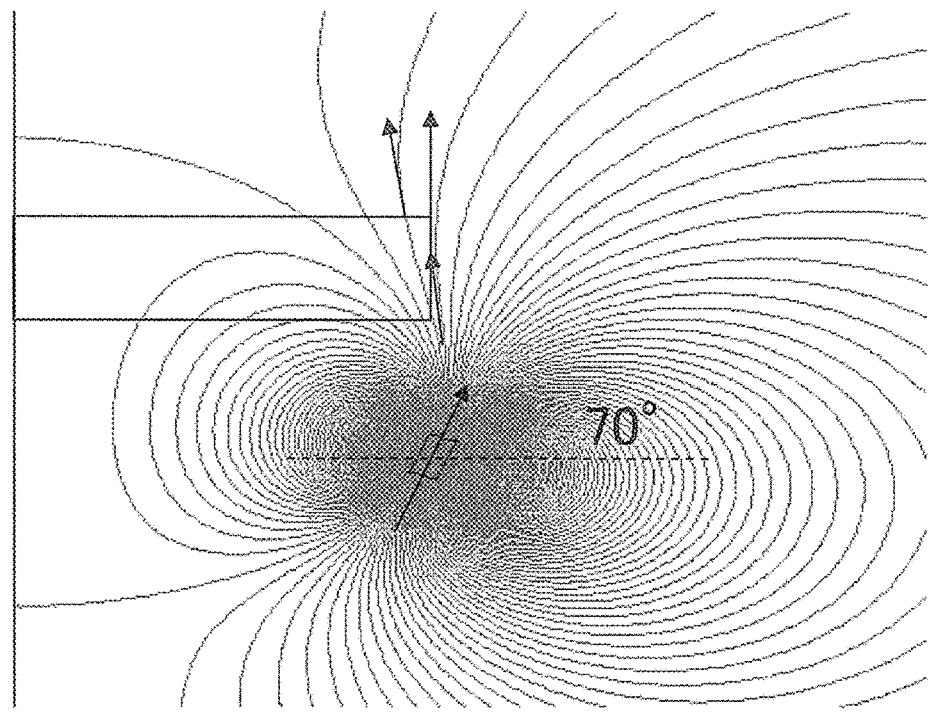
FIG. 14 is a diagram showing a magnetic field formed when an angle formed by the direction of the magnetic poles and the discharge surface is 70°.
Figure 15:
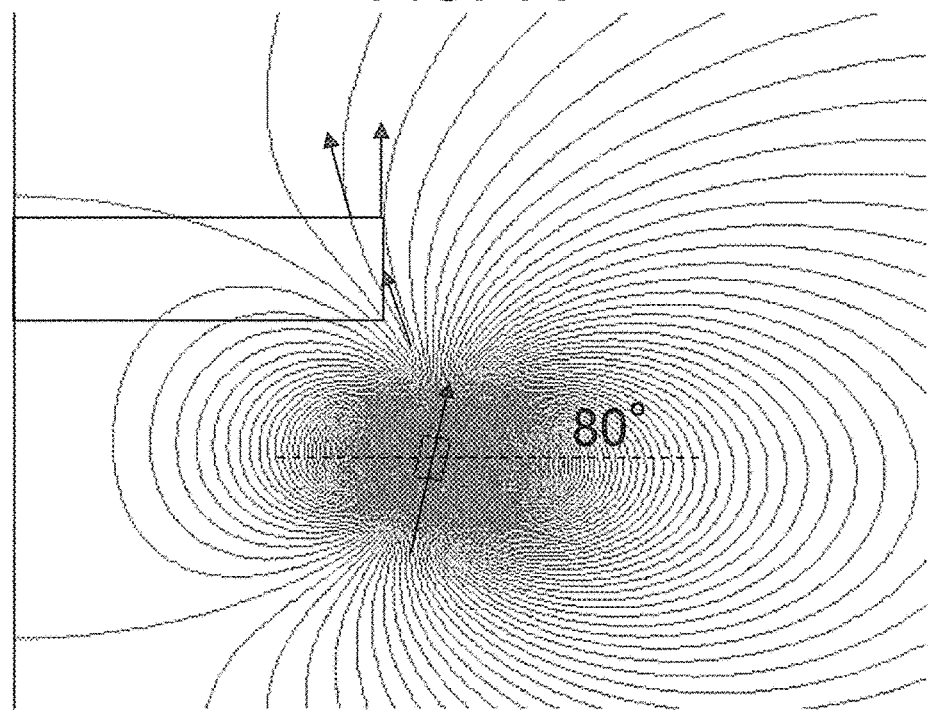
FIG. 15 is a diagram showing a magnetic field formed when an angle formed by the direction of the magnetic poles and the discharge surface is 80°.
Figure 16:
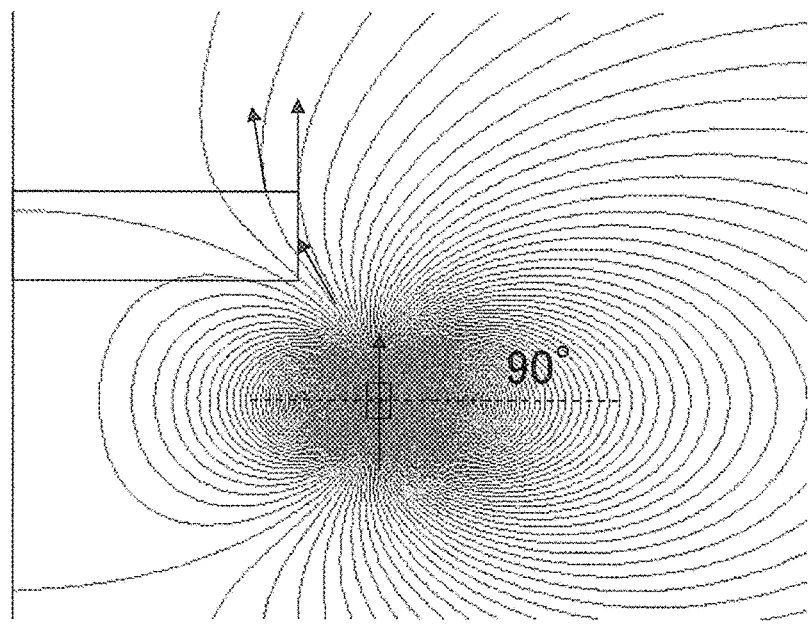
FIG. 16 is a diagram showing a magnetic field formed when an angle formed by the direction of the magnetic poles and the discharge surface is 90°.
Figure 17:
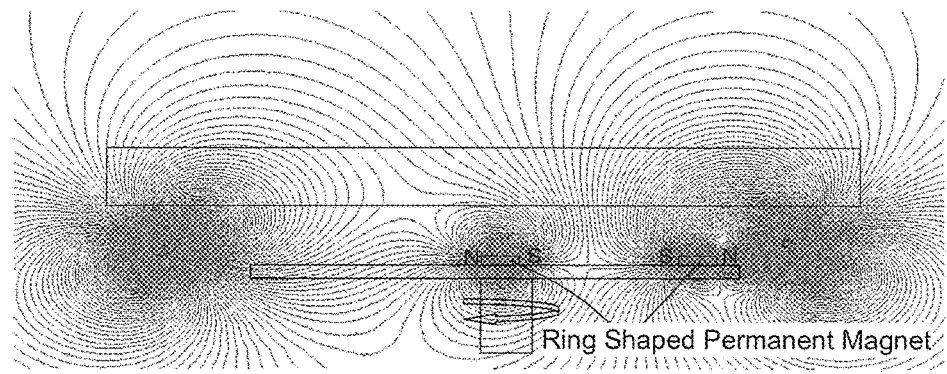
FIG. 17 is a diagram showing a magnetic field formed when a rotating magnetic field generating apparatus is disposed in a secured space at a back surface of a cathode.
Figure 18:
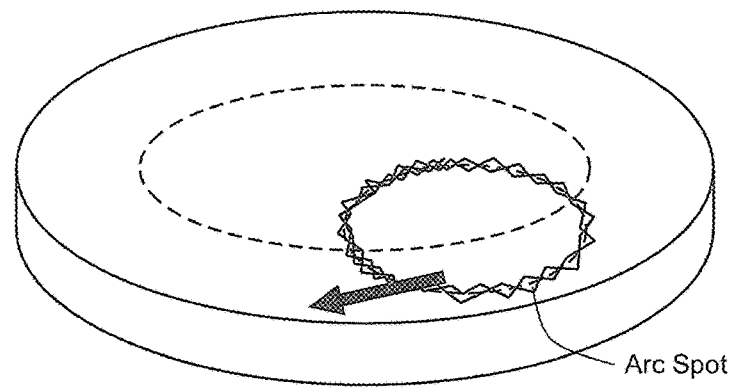
FIG. 18 is a diagram showing a movement of arc spots formed on a discharge surface of the cathode shown in FIG. 17.

An arc evaporation source of embodiment 2 was manufactured similar to embodiment 1 except for that a magnetic field generating apparatus, constructed by a ring shaped permanent magnet (a neodymium magnet with thickness of 2 mm, outer diameter of 46 mm and inner diameter of 31 mm, wherein the magnetic poles are oriented at the outside and inside direction) mounted on a rotating platform such that the center axis of the rotating platform and a center axis of the ring shaped permanent magnet are displaced, is disposed in the space of the back side of the cathode as shown in FIG. 17. Then, rotating the ring shaped permanent magnet in the ranges of 18 to 340 rpm and observing the surface roughness of the film, it was determined that the film has the lowest surface roughness when the rotation speed is approximately 60 rpm. In addition, the magnetic field of the aforementioned ring shaped permanent magnet at the discharge surface of the cathode was approximately 150 gauss.

(3) Embodiment 3

Figure 19:
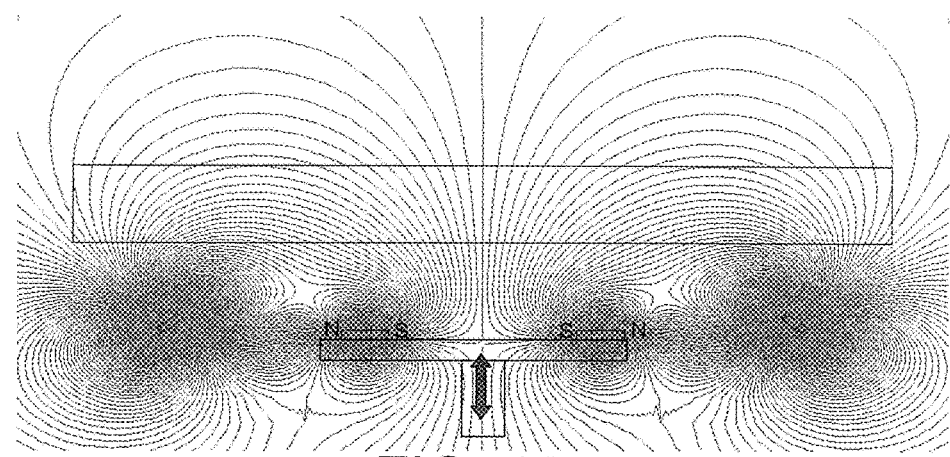
FIG. 19 is a diagram showing a magnetic field formed when a magnetic field generating apparatus with a displacement apparatus is disposed in a secured space at a back surface of a cathode.

An arc evaporation source of embodiment 3 is manufactured similar to embodiment 1 except for that a magnetic field generating apparatus with a displacement apparatus using the same ring shaped permanent magnet as embodiment 2 is disposed in the space of the back surface of the cathode as shown in FIG. 19.

Figure 20:
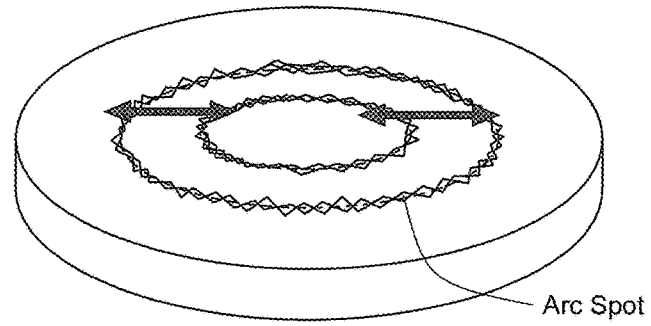
FIG. 20 is a diagram showing a movement of arc spots formed on a discharge surface of the cathode shown in FIG. 19.

The displacement apparatus is constructed by an electric actuator, and the permanent magnet is movable in the range of 50 mm in the vertical direction as shown in FIG. 19. As a result, as shown in FIG. 20, the arc spots mostly circulate around the vicinity of the center of the discharge surface of the cathode when the permanent magnet is moved to the top, and the arc spots mostly circulate around the vicinity of the outer circumference of the discharge surface of the cathode when the permanent magnet is moved to the bottom.

Figure 22:
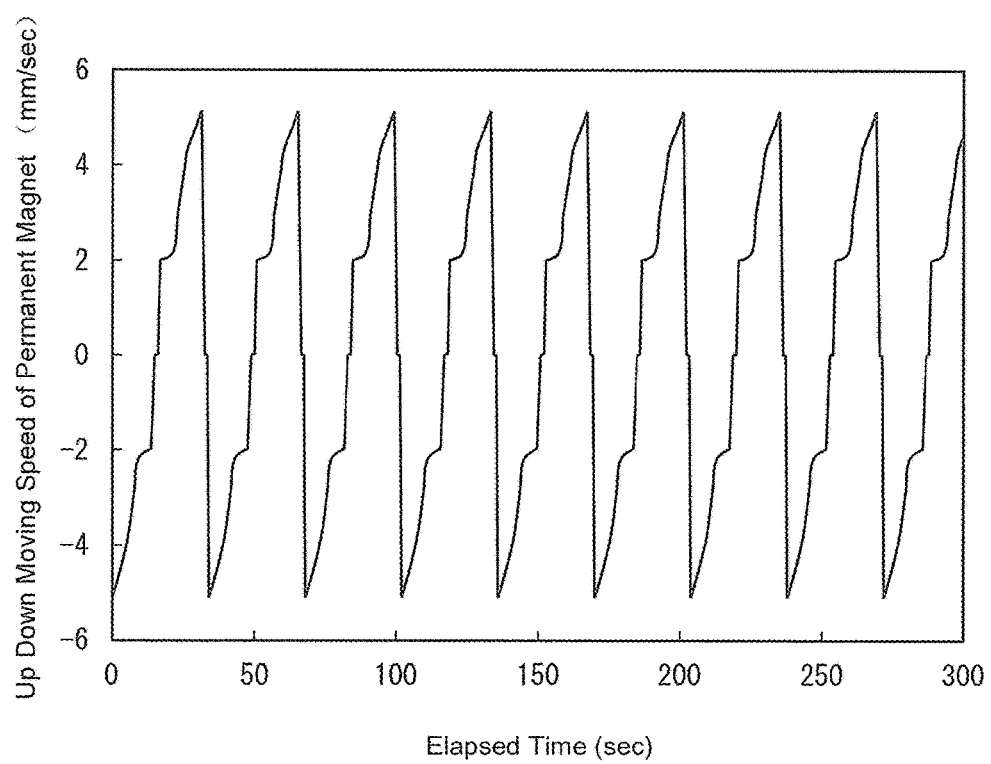
FIG. 22 is a diagram illustrating a vertical moving speed of a permanent magnet.

When the arc spots circulate around the vicinity of the center of the discharge surface of the cathode, the arc spots need to stay for a short period of time since the cathode is consumed quickly due to the short circumference length. Therefore, the movement of the magnet is made to be a patterned movement as shown in FIG. 22 instead of a fixed movement, such that the consumption of the cathode at the center and the outer circumference is balanced. In addition, here, one cycle was made to be 34 seconds and the time the magnet is at the top is shortened. In this way, the consumption of the cathode is made consistent across a large area.

(4) Comparison Example 1

Figure 24:
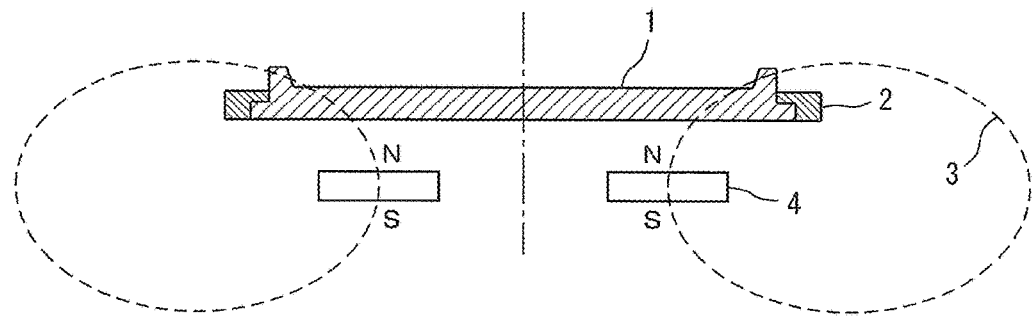
FIG. 24 is a diagram showing an exemplary configuration of a conventional arc evaporation source.
Figure 25:
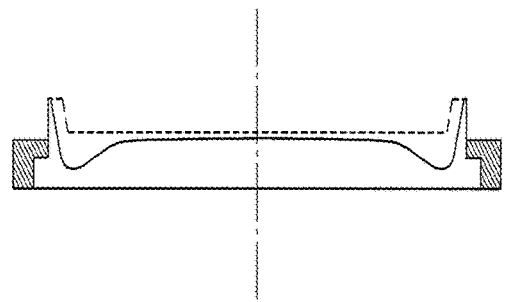
FIG. 25 is a diagram illustrating a change in shape of a cathode in a conventional arc evaporation source.

An arc evaporation source of comparison example 1 is manufactured by disposing a permanent magnet 4 at a back surface of a cathode 1 which is machined into the bank shape shown in FIG. 24 from a disc shaped Ti cathode material with a diameter of 150 mm and thickness of 15 mm such that the direction of the magnetic poles is oriented along the axis direction of the cathode.

(5) Comparison Example 2

Figure 26:
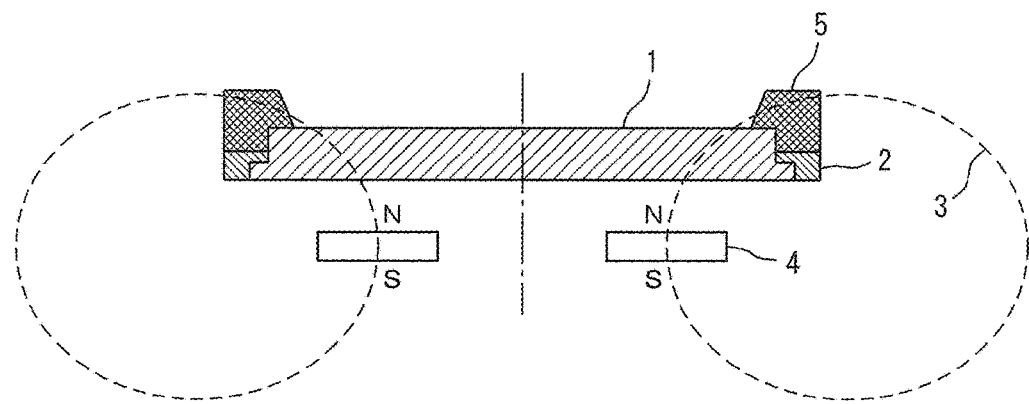
FIG. 26 is a diagram showing another exemplary configuration of a conventional arc evaporation source.
Figure 27A:
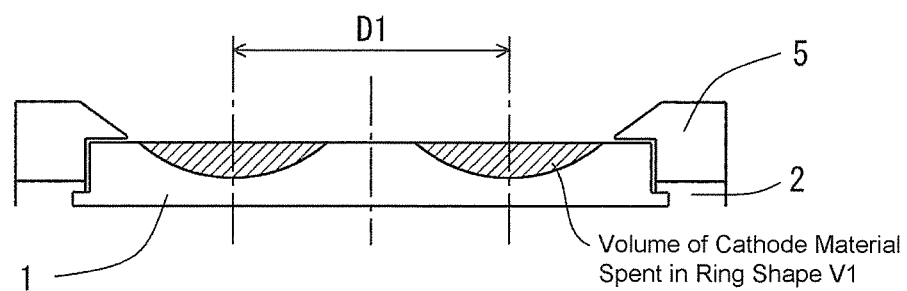
FIG. 27(a) and FIG. 27(b) are diagrams illustrating a change in shape of a cathode in a conventional arc evaporation source.
Figure 27B:
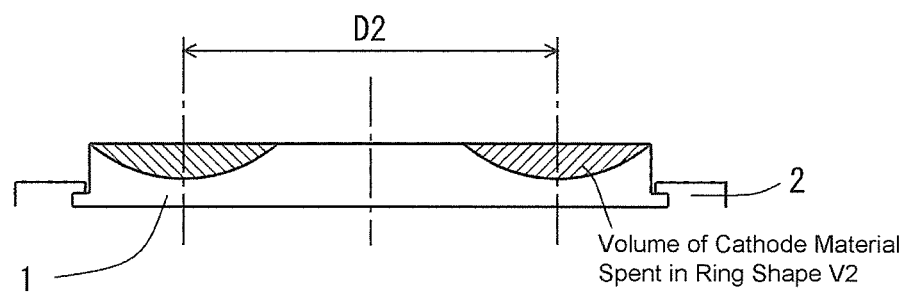

An arc evaporation source of comparison example 2 is manufactured by disposing a permanent magnet 4 at a back side of a cathode 1 which is machined into the shape shown in FIG. 26 from a disc shaped Ti cathode material of diameter 150 mm, thickness 15 mm such that the direction of the magnetic poles is oriented along the axis direction of the cathode.

(6) Embodiments 4 to 6 and Comparison Examples 3 and 4

Arc evaporation sources of embodiments 4 to 6 and comparison examples 3 and 4 are manufactured similar to embodiments 1 to 3 and comparison examples 1 and 2 respectively, except for using TiAl (50:50 atm %) as the cathode material.

(7) Embodiments 7 to 9 and Comparison Examples 5 and 6

Arc evaporation sources of embodiments 7 to 9 and comparison examples 5, 6 are manufactured similar to embodiments 1 to 3 and comparison examples 1 and 2 respectively, except for using AlCr (70:30 atm %) as the cathode material.

(8) Embodiments 10 to 12 and Comparison Examples 7 and 8

Arc evaporation sources of embodiments 10 to 12 and comparison examples 7 and 8 are manufactured similar to embodiments 1 to 3 and comparison examples 1 and 2 respectively, except for using Cr as the cathode material.

2. Film Formation

Each arc evaporation source was assembled to an ion plating device, and then sufficient vacuuming as well as out gassing by heater heating was performed, and 500 ccm of nitrogen gas was introduced and the pressure in the chamber was set to each of the pressures shown in TABLE 1.

For the substrate, a test piece of a high speed tool steel (SKH-51) is used and each of the bias voltages shown in Table 1 is applied, then a trigger mechanism (not shown) is used to start arc discharge of each of the cathodes, and arc currents shown in TABLE 1 are fed respectively and a 180 minute coating process is carried out. The film type, film thickness, film hardness, and surface roughness Rz of each of the obtained films are shown in TABLE 1.

Then, film formation is repeated until the film thickness reduces to 70% of the film thickness obtained by the first film formation, and the number of batches up until then is measured. That is to say, when the film thickness drops below 70%, there is not sufficient film thickness, and there is a possibility that the performance of the tools and mold which are the substrate (work) has decreased. It should be noted, as a counter measure, it is possible to extend the coating time in response to the reduction of the film thickness; however, due to difficulty of management it is not ideal. Therefore, the 70% point was set as the life span of the cathode. Results are shown in TABLE 1.

Figure 23:
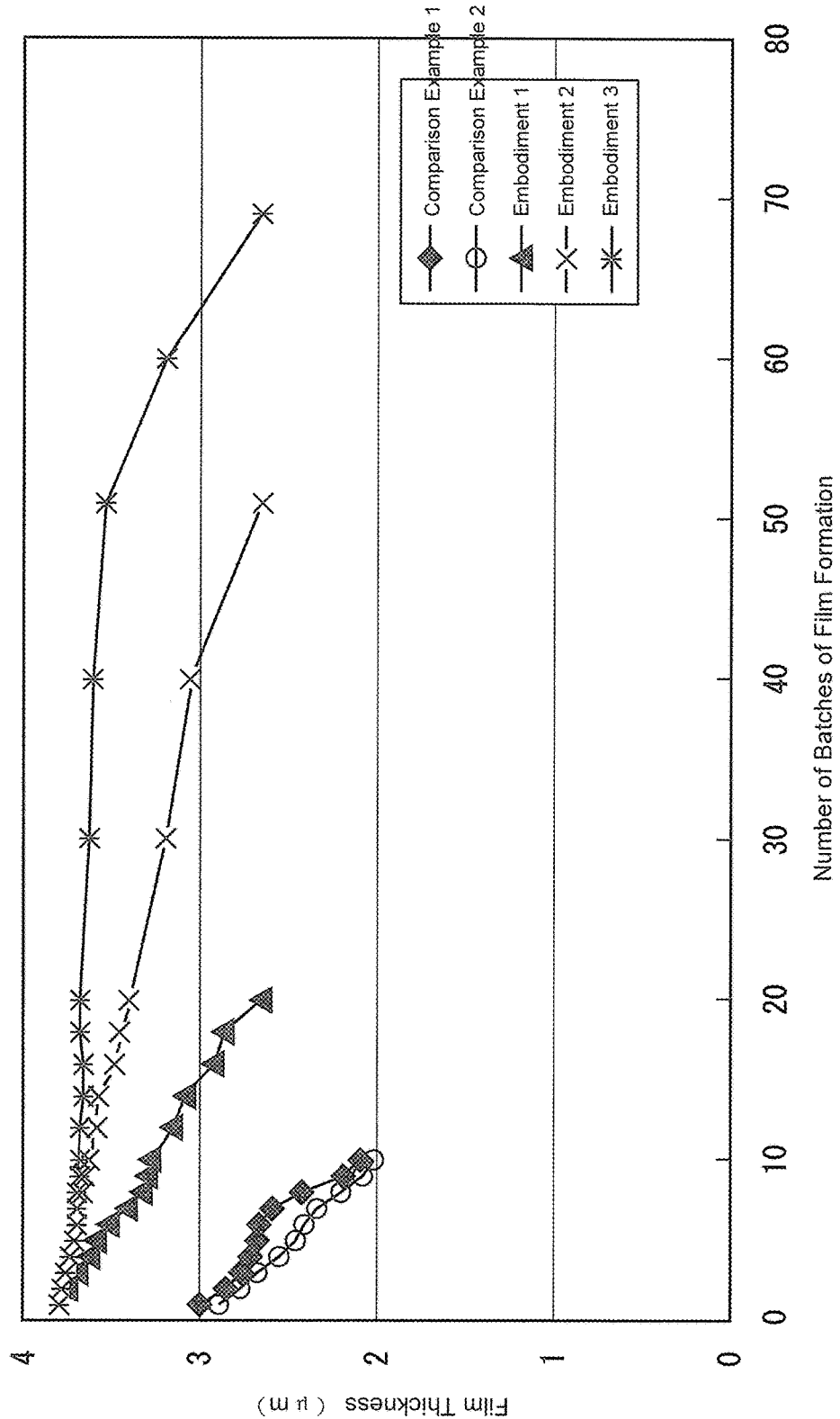
FIG. 23 is a figure illustrating a relationship of the number of batches of TiN film formation and a film thickness.

A relationship of the number of batches of film formation and the film thickness in the case of embodiments 1 to 3 and comparison examples 1 and 2 are shown in FIG. 23.

TABLE 1

|  | Cathode Material | Film Type | Film Formation Condition | Film Formation Results of Batch No. 1 | | | Number of Batches |
|---|---|---|---|---|---|---|---|
|  |  |  |  | Film Thickness (μm) | Film Hardness Hv 25 gf | Surface Roughness (um) |  |
| Comparison Example 1 | Ti | TiN | Pressure: 2.6 Pa Voltage Bias: −200 V Arc Current: 100 A | 3 | 2230 | 1.6 | 10 |
| Comparison Example 2 |  |  |  | 2.8 | 2250 | 1.5 | 10 |
| Embodiment 1 |  |  |  | 3.8 | 2230 | 1.6 | 20 |
| Embodiment 2 |  |  |  | 3.9 | 2190 | 1.2 | 51 |
| Embodiment 3 |  |  |  | 3.9 | 2200 | 1.1 | 69 |

TABLE 1-continued

| | Cathode Material | Film Type | Film Formation Condition | Film Formation Results of Batch No. 1 | | | |
|---|---|---|---|---|---|---|---|
| | | | | Film Thickness (μm) | Film Hardness Hv 25 gf | Surface Roughness (um) | Number of Batches |
| Comparison Example 3 | TiAl (50:50 atm %) | TiAlN | Pressure: 3.9 Pa Voltage Bias: −125 V | 2.8 | 2440 | 2.1 | 8 |
| Comparison Example 4 | | | Arc Current: 100 A | 2.6 | 2400 | 2.2 | 8 |
| Embodiment 4 | | | | 3.5 | 2500 | 2.4 | 15 |
| Embodiment 5 | | | | 3.7 | 2440 | 1.7 | 38 |
| Embodiment 6 | | | | 3.6 | 2560 | 1.7 | 55 |
| Comparison Example 5 | AlCr (70:30 atm %) | AlCrN | Pressure: 5.2 Pa Voltage Bias: −125 V | 2.5 | 2310 | 2.3 | 9 |
| Comparison Example 6 | | | Arc Current: 100 A | 2.3 | 2300 | 2.2 | 9 |
| Embodiment 7 | | | | 3.1 | 2300 | 2.2 | 17 |
| Embodiment 8 | | | | 3.1 | 2310 | 1.6 | 45 |
| Embodiment 9 | | | | 3.1 | 2350 | 1.7 | 60 |
| Comparison Example 7 | Cr | CrN | Pressure: 2.6 Pa Voltage Bias: −50 V | 2.8 | 1780 | 2.2 | 15 |
| Comparison Example 8 | | | Arc Current: 120 A | 2.5 | 1750 | 2.3 | 15 |
| Embodiment 10 | | | | 3.4 | 1700 | 2.3 | 30 |
| Embodiment 11 | | | | 3.6 | 1810 | 1.9 | 72 |
| Embodiment 12 | | | | 3.5 | 1790 | 1.6 | 101 |

It is known from TABLE 1 that, in the case of any cathode material, the embodiments have an increase in the number of batches and the expensive cathode material can be used effectively by adopting the invention, compared to the comparison examples.

Furthermore, referring to FIG. 23, in embodiments 1 to 3 which use Ti as the cathode material for film formation, it is seen that embodiments 2 and 3 have a gradual reduction in film thickness even when the number of batches increases, and therefore it is understood that the cathode material is more effectively used in embodiments 2 and 3.

In addition, in embodiments 2 and 3, the surface roughness of the film is also reduced, and it is thought to be due to the arc spots being forcibly moved by the rotation and movements of the magnet.

Furthermore, results such as the above are the same in other embodiments where the cathode material is different.

Embodiments of the invention were described above. However, the invention is not limited to the above mentioned embodiments. Various modifications can be made to the above mentioned embodiments within the same or equivalent range of the invention.

DESCRIPTION OF THE LABELS

1 Cathode
2 Fixing Ring
3 Magnetic Line
4 Permanent Magnet
5 Confinement Ring

What is claimed is:

1. An arc evaporation source, for melting and evaporating a cathode material by arc discharge in a vacuum for film formation on a surface of a substrate, the arc evaporation source comprising:
a cathode formed in a substantially disc shape; and
a magnetic field generating apparatus disposed at a back side of the cathode,
wherein the magnetic field generating apparatus generates a magnetic field by at least one permanent magnet disposed at a back surface of the cathode, the permanent magnet is oriented in a direction that is 20° to 50° with respect to a discharge surface of the cathode, which forms
magnetic lines that form an acute angle with respect to a substrate direction at an outer circumferential surface of the cathode,
magnetic lines that are substantially perpendicular to the discharge surface at an outermost circumference part of the discharge surface of the cathode, and
magnetic lines that form an acute angle with respect to a center direction of the cathode at a region towards the outer circumferential surface of the discharge surface of the cathode.

2. The arc evaporation source as claimed in claim 1, wherein the permanent magnet is oriented in a direction that is 40° to 45° with respect to the discharge surface of the cathode.

3. The arc evaporation source as claimed in claim 1, wherein at least one other magnetic field generating apparatus, which rotates in a plane substantially parallel to the discharge surface of the cathode, is disposed at the back side of the cathode.

4. The arc evaporation source as claimed in claim 1, wherein at least one magnetic field generating apparatus with a displacement apparatus such that a distance between the permanent magnet and the cathode is changeable is disposed at the back surface of the cathode.

* * * * *